(12) United States Patent
Frick et al.

(10) Patent No.: US 10,879,860 B2
(45) Date of Patent: Dec. 29, 2020

(54) MAGNETIC OPERATIONAL AMPLIFIER

(71) Applicants: UNIVERSITE DE STRASBOURG, Strasbourg (FR); CENTRE NATIONAL DE LA RECHERCHE SCIENTIFIQUE CNRS, Paris (FR)

(72) Inventors: Vincent Frick, Strasbourg (FR); Laurent Osberger, Strasbourg (FR)

(73) Assignees: CENTRE NATIONAL DE LA RECHERCHE SCIENTIFIQUE (CNRS), Paris (FR); UNIVERSITE DE STRASBOURG, Strasbourg (FR)

( * ) Notice: Subject to any disclaimer, the term of this patent is extended or adjusted under 35 U.S.C. 154(b) by 0 days.

(21) Appl. No.: 16/099,902

(22) PCT Filed: Apr. 28, 2017

(86) PCT No.: PCT/EP2017/060245
§ 371 (c)(1),
(2) Date: Nov. 8, 2018

(87) PCT Pub. No.: WO2017/194334
PCT Pub. Date: Nov. 16, 2017

(65) Prior Publication Data
US 2019/0181818 A1    Jun. 13, 2019

(30) Foreign Application Priority Data
May 10, 2016  (EP) .................. 16169019

(51) Int. Cl.
*H03F 3/45*       (2006.01)
*G01R 33/00*   (2006.01)
(Continued)

(52) U.S. Cl.
CPC ..... *H03F 3/45183* (2013.01); *G01R 33/0029* (2013.01); *G01R 33/0088* (2013.01);
(Continued)

(58) Field of Classification Search
CPC ........ H03F 3/45183; H03F 15/00; H03F 9/00; H03F 3/45659; H03F 3/45475;
(Continued)

(56) References Cited

U.S. PATENT DOCUMENTS 5,438,990 A * 8/1995 Wahlstrand ........ A61N 1/37217
                                                  257/E27.005
5,801,533 A * 9/1998 Kalb, Jr. ................ G01R 33/06
                                                  257/E27.005
(Continued)

FOREIGN PATENT DOCUMENTS

| EP | 1 830 162 A1 | 9/2007 |
| EP | 2 005 582 A1 | 12/2008 |
| WO | WO 2007/107963 A1 | 9/2007 |

OTHER PUBLICATIONS

International Search Report as issued in International Patent Application No. PCT/EP2017/060245, dated May 23, 2017.
(Continued)

*Primary Examiner* — Khanh V Nguyen
(74) *Attorney, Agent, or Firm* — Pillsbury Winthrop Shaw Pittman LLP

(57) ABSTRACT

A magnetic operational amplifier having a differential stage includes a first magnetic field effect transistor MAGFET and a differential signal conditioner, the differential signal conditioner including a load stage, a differential input pair connected to the load stage and a biasing current source connected to the differential input pair; the magnetic field effect transistor MAGFET being connected to the load stage as a second differential input pair and the differential signal conditioner including a second biasing current source connected to the magnetic field effect transistor MAGFET.

6 Claims, 6 Drawing Sheets

(51) Int. Cl.
*H03F 9/00* (2006.01)
*H03F 3/393* (2006.01)
*H03F 15/00* (2006.01)

(52) U.S. Cl.
CPC ......... *H03F 3/393* (2013.01); *H03F 3/45475* (2013.01); *H03F 3/45659* (2013.01); *H03F 9/00* (2013.01); *H03F 15/00* (2013.01); *H03F 2200/129* (2013.01); *H03F 2200/372* (2013.01); *H03F 2200/375* (2013.01); *H03F 2200/411* (2013.01); *H03F 2200/75* (2013.01); *H03F 2203/45082* (2013.01); *H03F 2203/45088* (2013.01); *H03F 2203/45116* (2013.01); *H03F 2203/45134* (2013.01); *H03F 2203/45138* (2013.01); *H03F 2203/45188* (2013.01); *H03F 2203/45192* (2013.01); *H03F 2203/45208* (2013.01); *H03F 2203/45226* (2013.01); *H03F 2203/45276* (2013.01); *H03F 2203/45346* (2013.01); *H03F 2203/45361* (2013.01); *H03F 2203/45434* (2013.01); *H03F 2203/45642* (2013.01); *H03F 2203/45656* (2013.01); *H03F 2203/45674* (2013.01); *H03F 2203/45681* (2013.01); *H03F 2203/45684* (2013.01)

(58) Field of Classification Search
CPC ........... H03F 3/393; H03F 2203/45684; H03F 2203/45674; H03F 2203/45656; H03F 2203/45642; H03F 2203/45434; H03F 2203/45361; H03F 2203/45346; H03F 2203/45276; H03F 2203/45226; H03F 2203/45208; H03F 2203/45192; H03F 2203/45188; H03F 2203/45138; H03F 2203/45134; H03F 2203/45116; H03F 2203/45088; H03F 2203/45082; H03F 2200/75; H03F 2200/411; H03F 2200/375; H03F 2200/372; H03F 2200/129; H03F 2203/45681; G01R 33/0029; G01R 33/0088

USPC .................................................. 330/252, 253
See application file for complete search history.

(56) References Cited

U.S. PATENT DOCUMENTS

| 6,469,538 | B1* | 10/2002 | Gupta | G01R 31/3004 |
| | | | | 324/750.3 |
| 7,199,434 | B2* | 4/2007 | Li | H01L 29/82 |
| | | | | 257/252 |
| 7,642,851 | B2* | 1/2010 | Douglas | H03F 3/453 |
| | | | | 330/253 |
| 7,733,179 | B2* | 6/2010 | Forejt | H03F 3/45183 |
| | | | | 330/253 |
| 9,407,221 | B2* | 8/2016 | Itakura | H03F 3/45183 |
| 9,915,641 | B2* | 3/2018 | Shapiro | G01N 33/483 |
| 2003/0132803 | A1* | 7/2003 | Matsumoto | H03F 3/45183 |
| | | | | 330/253 |
| 2007/0268060 | A1 | 11/2007 | Ebner | |
| 2012/0032944 | A1* | 2/2012 | Kojima | H03F 3/3022 |
| | | | | 345/212 |
| 2012/0313704 | A1* | 12/2012 | Doany | H03F 3/082 |
| | | | | 330/253 |

OTHER PUBLICATIONS

Liu, S.-I., et al., "SPICE Macro Model for MAGFET and its Applications," IEEE Transactions on Circuits and Systems II: Analog and Digital Signal Processing, Institute of Electrical and Electronics Engineers Inc., vol. 46, No. 4, Apr. 1999, XP000902763, pp. 370-375.

Kuo, C.-H., et al., "CMOS Oversampling ΔΣ Magnetic-to-Digital Converters," IEEE Journal of Solid-State Circuits, vol. 36, No. 10, Oct. 2001, XP011061607, pp. 1582-1586.

Frick, V., et al. "A Novel Chopping-Spinning MAGFET Device," 2010 17$^{th}$ IEEE International Conference on Electronics, Circuits, and Systems (ICECS), Dec. 2010, XP031923079, pp. 815-818.

Ho, L.-A., et al., "CMOS Oversampling ΔΣ Magnetic to Digital Converters," Conference Proceedings / ISCAS 2001, the 2001 IEEE International Symposium on Circuits and Systems, May 2001, vol. 1, XP010541448, pp. 388-391.

\* cited by examiner

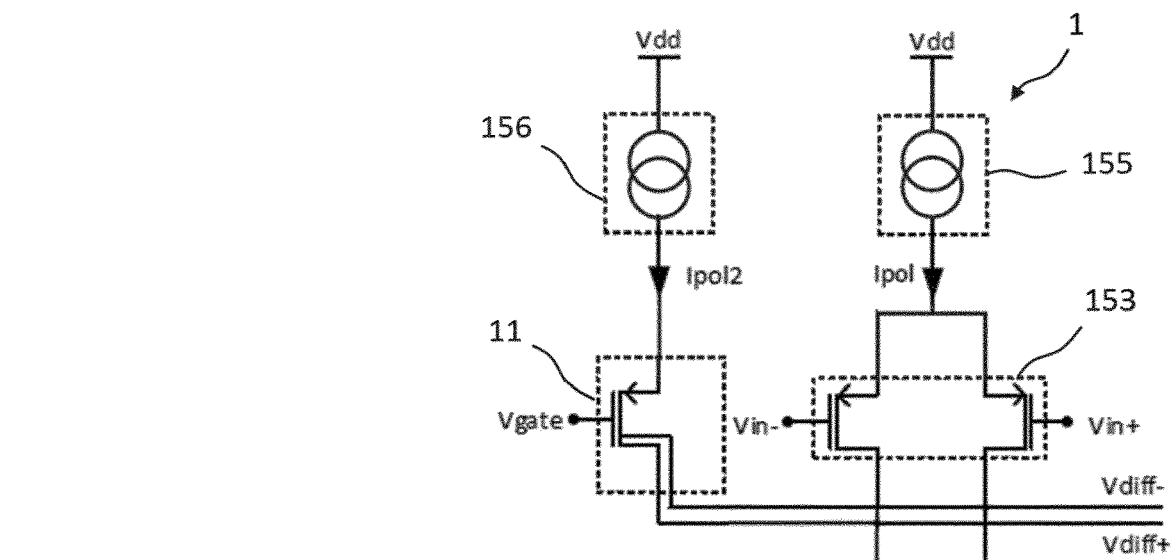
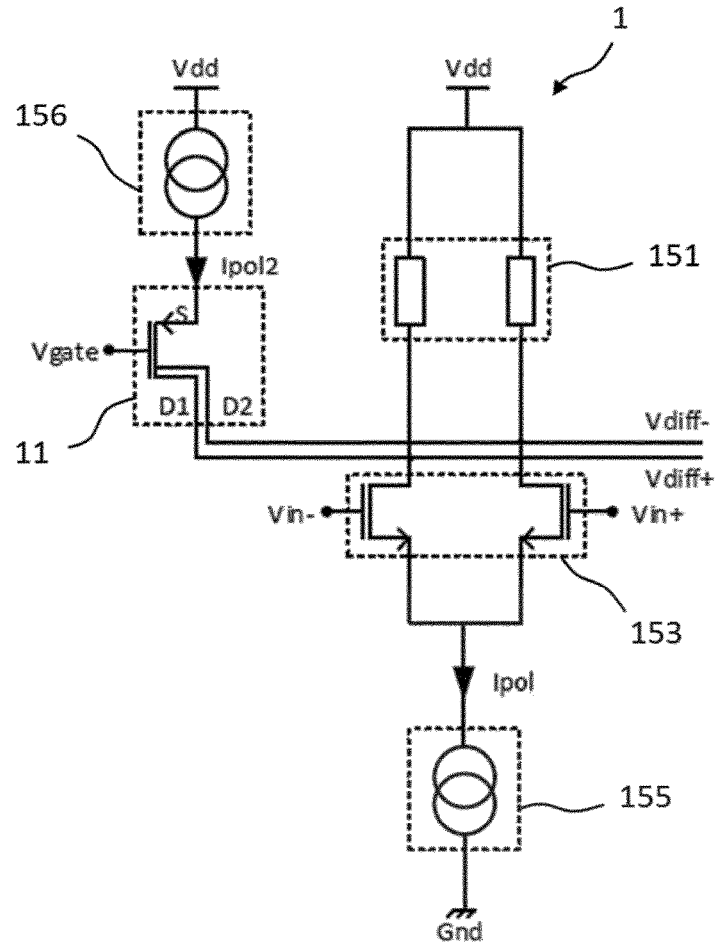
Fig. 5c
Fig. 5d

MAGNETIC OPERATIONAL AMPLIFIER

CROSS REFERENCE TO RELATED APPLICATIONS

This application is the U.S. National Stage of PCT/EP2017/060245, filed Apr. 28, 2017, which in turn claims priority to European Patent Application No. 16169019.3 filed May 10, 2016, the entire contents of all applications are incorporated herein by reference in their entireties.

TECHNICAL FIELD

An aspect of the present invention relates to the technical field of magnetic field effect transistors MAGFET, and in particular to the technical field of magnetic operational amplifiers.

BACKGROUND OF THE INVENTION

FIG. 1 illustrates the structure of a classical differential amplifier stage A1 that comprises:
- a load stage 151,
- a differential input pair 153 having a terminal Vin− and a terminal Vin+,
- and a biasing current source 155.

A biasing current source injects and maintains a constant current in a branch of an electric circuit. In the example of FIG. 1, the constant current injected and maintained by the biasing current source 155 is named Ipol. The biasing current Ipol is maintained constant regardless of the variations applied to the currents IN and IP circulating in the differential input pair 153 and the following equation applies:

$$IN+IP=Ipol$$

Thanks to the differential input pair 153, the difference between the currents IN and IP is proportional to the difference between the potentials applied to the terminal Vin− and to the terminal Vin+.

Thanks to the load stage 151, the difference between the currents IN and IP is converted into a voltage, thus giving an amplified image of the potential difference applied to the terminals Vin− and Vin+.

Three configurations of the differential stage of a magnetic operational amplifier MOP using a magnetic field effect transistor MAGFET are known.

FIG. 2 illustrates a first differential stage A2 of a MOP comprising:
- the load stage 151,
- the differential input pair 153 with terminals Vin− and Vin+, and
- a MAGFET 255 used in a current mirror.

Used in a current mirror as a biasing current source, the MAGFET 255 has to insure a total biasing current in the differential input pair 153 that allows biasing-current proportional open-loop gain of the MOP. Said constraint prevents from controlling the gate voltage of the MAGFET 255. Said constraint thus prevents from choosing the operating regime of the MAGFET 255 and affects its performances, in particular in terms of sensitivity, thermal noise, consumption.

FIG. 3 illustrates a second differential stage A3 of a MOP comprising:
- a MAGFET 351 as a load stage,
- the differential input pair 153 with terminals Vin− and Vin+, and
- the biasing current source 155.

Used as a load stage and in order to insure the stability of the common mode at the output of the MOP, the gate of the MAGFET 351 has to be controlled by the application of a constant voltage or by a control amplifier of the common mode used in a negative feedback. Controlling the gate of the MAGFET 351 by the application of a constant voltage prevents from choosing the operating regime of the MAGFET 255. When controlling the gate of the MAGFET 351 by a negative feedback of a control amplifier of the common mode, a variation of the gate voltage implies a variation in sensitivity for the MOP. In other words, the sensitivity of the MOP varies according to the control voltage of the common mode: the sensing function of the MOP A3 is therefore unusable.

Finally, two MAGFET may be used as a differential input pair, allowing to apply an external voltage and thus to realize a function, such as an amplifier or a follower for example. FIG. 4 illustrates a third differential stage A4 of a MOP comprising:
- the load stage 151,
- a first MAGFET 453 and a second MAGFET 454 as a differential input pair with terminals Vin− and Vin+, and
- the biasing current source 155.

But applying an external voltage on the gate of a MAGFET implies a variation of its sensitivity: the same problem arises, as for the MAGFET used as load stage.

SUMMARY OF THE INVENTION

An objective of the invention is to realize a magnetic operational amplifier MOP based on a magnetic field effect transistor MAGFET whose operating regime may be freely chosen.

To this end, according to an aspect of the invention, it is provided a magnetic operational amplifier having a differential stage comprising:
- a first magnetic field effect transistor MAGFET and
- a differential signal conditioner comprising:
  - a load stage,
  - a differential input pair connected to the load stage and
  - a biasing current source connected to the differential input pair, wherein the first magnetic field effect transistor MAGFET is connected to the load stage as a second differential input pair and wherein the differential signal conditioner comprises a second biasing current source connected to the magnetic field effect transistor MAGFET.

Thanks to the invention, the gate voltage and the biasing current of the magnetic field effect transistor MAGFET are independent of the biasing current of the differential input pair. The operating regime of the magnetic field effect transistor MAGFET is thus totally controllable.

Apart from the characteristics mentioned above in the previous paragraph, the magnetic operational amplifier according to an aspect of the invention may have one or several complementary characteristics among the following characteristics considered individually or in any technically possible combinations:

The first magnetic field effect transistor MAGFET is preferentially an n-type magnetic field effect transistor MAGFET, because an n-type magnetic field effect transistor MAGFET typically has a better mobility and thus a better sensitivity to a magnetic field than a p-type magnetic field effect transistor MAGFET. The first magnetic field effect transistor MAGFET may alternatively be a p-type magnetic field effect transistor MAGFET.

The differential input pair can equally be an n-type or p-type differential input pair.

The differential signal conditioner comprises at least one differential amplification stage to further amplify a useful signal.

The differential signal conditioner further comprises a chopper to eliminate the offset and low-frequency noise of the differential signal conditioner, the chopper comprising a first stage of modulation of a useful signal and a second stage of demodulation of the useful signal, the useful signal entering the second stage of demodulation being a voltage.

When the differential signal conditioner comprises at least one differential amplification stage and a chopper, the second stage of demodulation of the chopper is placed after the last differential amplification stage to eliminate the offset and low-frequency noise of the differential signal conditioner and of each differential amplification stage.

The magnetic operational amplifier comprises a magnetic sensor connected to the load stage as a second differential input pair and having:
  a first configuration corresponding to the first magnetic field effect transistor MAGFET,
  a second configuration corresponding to a second magnetic field effect transistor MAGFET,
  a third configuration corresponding to a third magnetic field effect transistor MAGFET and
  a fourth configuration corresponding to a fourth magnetic field effect transistor MAGFET,
wherein the differential signal conditioner further comprises a spinning current module to eliminate the offset and low-frequency noise of the magnetic sensor, the spinning current module periodically alternating the first, second, third and fourth configurations of the magnetic sensor.

BRIEF DESCRIPTION OF THE FIGURES

FIG. 5c illustrates a differential stage of a magnetic operational amplifier MOP based on a first magnetic field effect transistor MAGFET, according to a third embodiment of the invention.

FIG. 5d illustrates a differential stage of a magnetic operational amplifier MOP based on a first magnetic field effect transistor MAGFET, according to a fourth embodiment of the invention.

DETAILED DESCRIPTION OF THE PREFERRED EMBODIMENT

Some embodiments of apparatus and methods in accordance with embodiments of the present invention are now described, by way of example only, and with reference to the accompanying drawings. The description is to be regarded as illustrative in nature and not as restricted.

FIG. 1, FIG. 2, FIG. 3 and FIG. 4 have been previously described.

Figure 1:
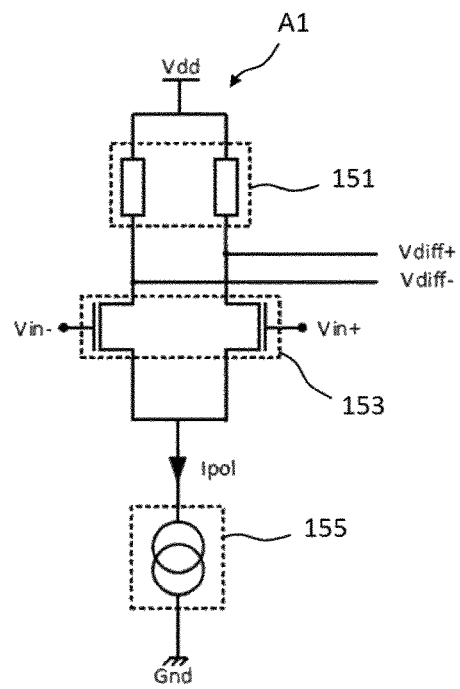
FIG. 1 illustrates the structure of a classical differential amplifier stage.
Figure 2:
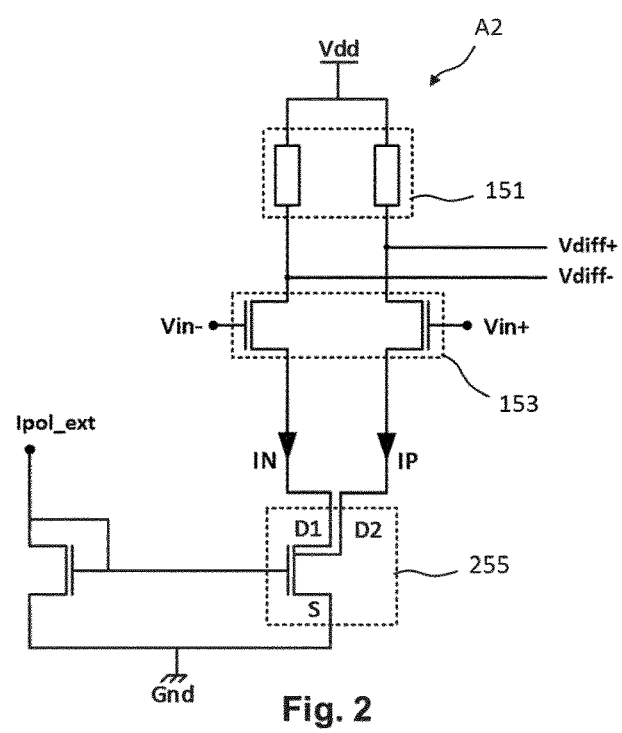
FIG. 2 illustrates a first differential stage of a magnetic operational amplifier MOP based on a magnetic field effect transistor MAGFET, according to the previous art.
Figure 3:
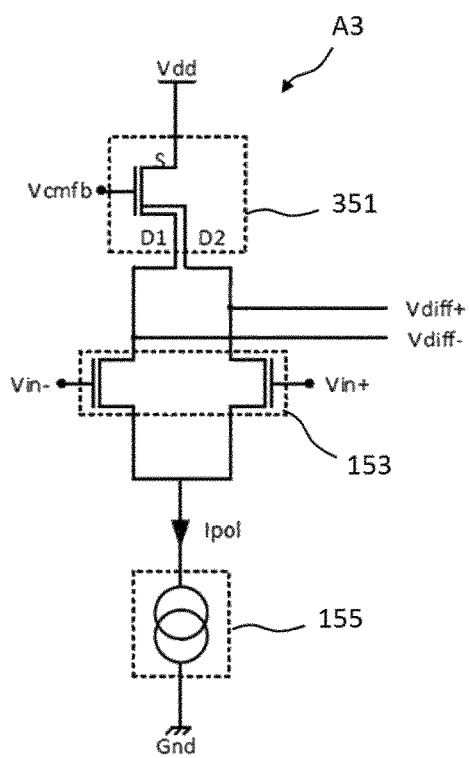
FIG. 3 illustrates a second differential stage of a magnetic operational amplifier MOP based on a magnetic field effect transistor MAGFET, according to the previous art.
Figure 4:
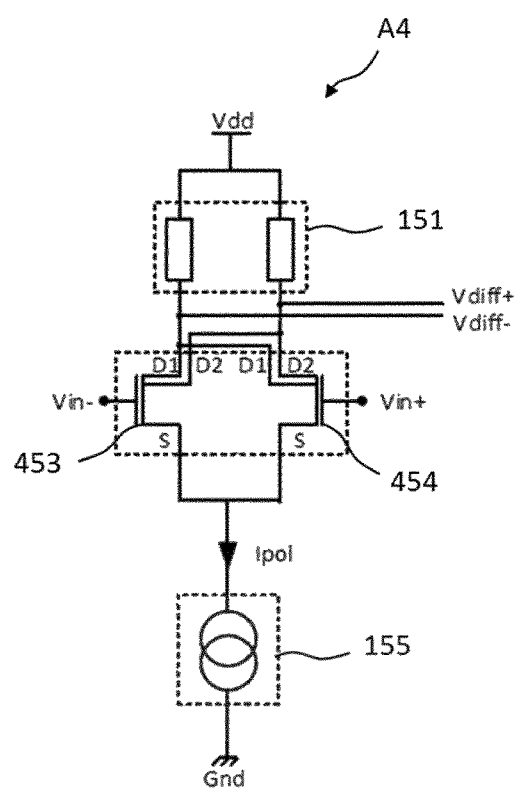
FIG. 4 illustrates a third differential stage of a magnetic operational amplifier MOP based on a magnetic field effect transistor MAGFET, according to the previous art.
Figure 5A:
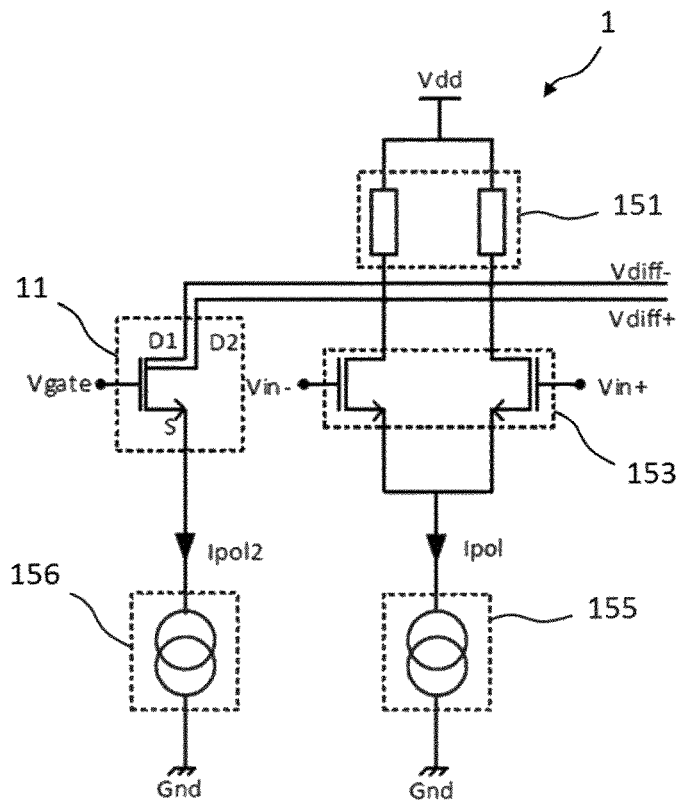
FIG. 5a illustrates a differential stage of a magnetic operational amplifier MOP based on a first magnetic field effect transistor MAGFET, according to a first embodiment of the invention.

FIG. 5a shows a differential stage 1 of a magnetic operational amplifier MOP according to a first embodiment of the invention. The differential stage 1 comprises a first magnetic field effect transistor MAGFET 11 and a differential signal conditioner. The first MAGFET 11 has a source S, a first drain D1 and a second drain D2, a gate voltage Vgate. The differential signal conditioner comprises:
  a load stage 151,
  a differential input pair 153 connected to the load stage 151,
  a biasing current source 155 connected to the differential input pair 153 and
  a second biasing current source 156 connected to the first MAGFET 11.

The biasing current source 155 injects and maintains a constant biasing current Ipol in the differential input pair 153. The first MAGFET 11 is connected to the load stage 151 as a second differential input pair. The second biasing current source 156 injects and maintains a constant second biasing current Ipol2 in the first MAGFET 11. According to the first embodiment of the invention, the first magnetic field effect transistor MAGFET 11 is an n-type magnetic field effect transistor MAGFET and the differential input pair 153 is an n-type differential input pair.

Figure 5B:
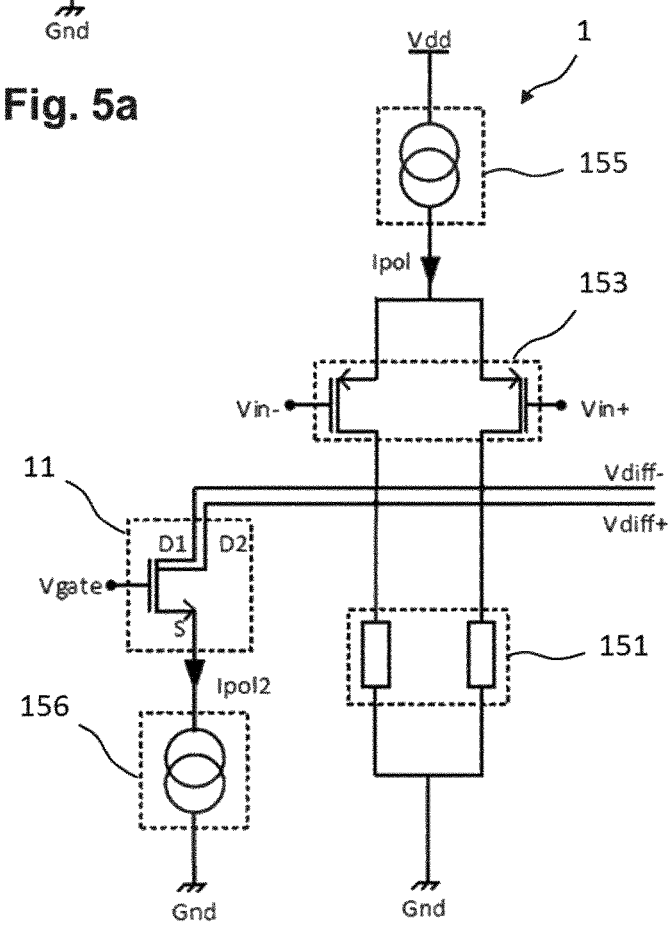
FIG. 5b illustrates a differential stage of a magnetic operational amplifier MOP based on a first magnetic field effect transistor MAGFET, according to a second embodiment of the invention.

FIG. 5b shows a differential stage 1 of a magnetic operational amplifier MOP according to a second embodiment of the invention, wherein the first magnetic field effect transistor MAGFET 11 is n-type magnetic field effect transistor MAGFET and the differential input pair 153 is a p-type differential input pair.

FIG. 5c shows a differential stage 1 of a magnetic operational amplifier MOP according to a third embodiment of the invention, wherein the first magnetic field effect transistor MAGFET 11 is a p-type magnetic field effect transistor and the differential input pair 153 is a p-type differential input pair.

FIG. 5d shows a differential stage 1 of a magnetic operational amplifier MOP according to a fourth embodiment of the invention, wherein the first magnetic field effect transistor MAGFET 11 is p-type magnetic field effect transistor and the differential input pair 153 is an n-type differential input pair.

Figure 6:
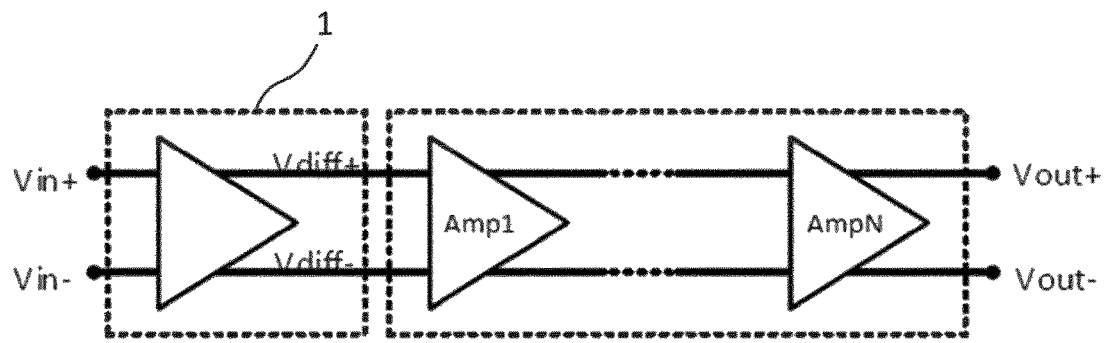
FIG. 6 illustrates the differential stage of a magnetic operational amplifier MOP based on a first magnetic field effect transistor MAGFET according to an embodiment of the invention, associated to differential amplification stages.

The differential stage 1 of the magnetic operational amplifier MOP may be associated to at least one amplification stage Amp1. FIG. 6 shows the differential stage 1 of a magnetic operational amplifier MOP according to an embodiment of the invention, associated to N differential amplification stages Amp1, AmpN with N a natural number greater than or equal to 2.

Figure 7A:
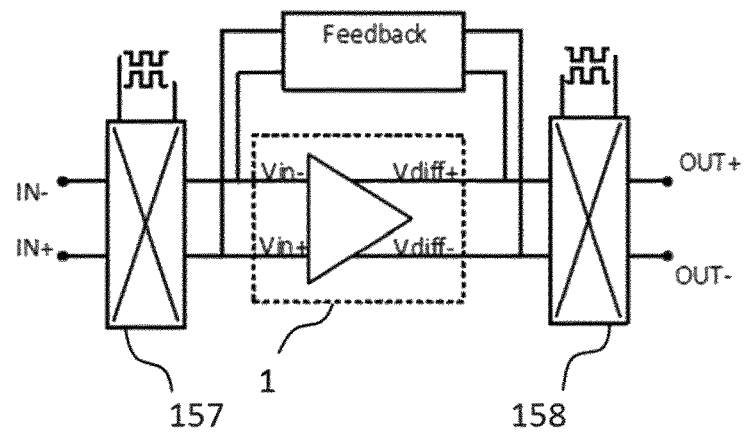
FIG. 7a illustrates the differential stage of a magnetic operational amplifier MOP based on a first magnetic field effect transistor MAGFET according to an embodiment of the invention, associated to a chopper.

FIG. 7a shows the differential stage 1 of a magnetic operational amplifier MOP according to an embodiment of the invention, wherein the differential signal conditioner further comprises a chopper comprising a first stage 157 of modulation of a useful signal and a second stage 158 of demodulation of the useful signal.

Figure 7B:
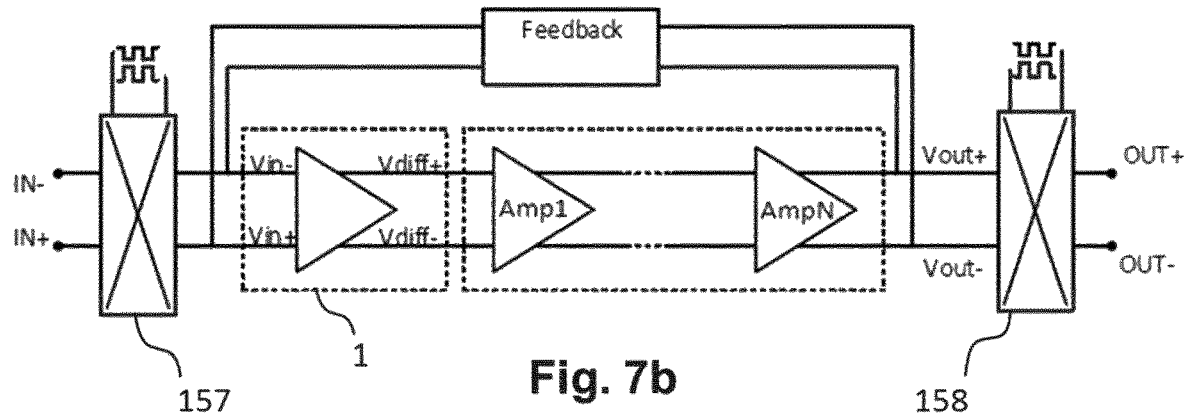
FIG. 7b illustrates the differential stage of a magnetic operational amplifier MOP based on a first magnetic field effect transistor MAGFET according to an embodiment of the invention, associated to differential amplification stages and to a chopper.

FIG. 7b shows the differential stage 1 of a magnetic operational amplifier MOP according to an embodiment of the invention, associated to at least one amplification stage Amp1, and wherein the differential signal conditioner comprises the chopper having the first stage 157 of modulation of a useful signal and the second stage 158 of demodulation of the useful signal.

Figure 8:
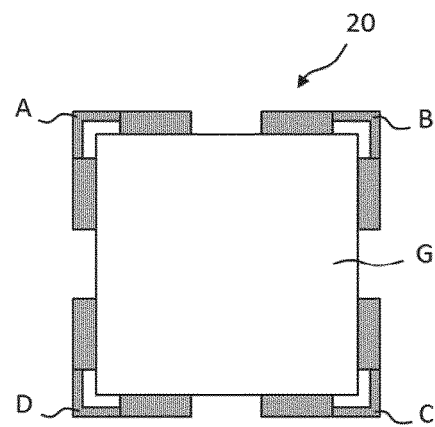
FIG. 8 illustrates a magnetic sensor having four possible symmetric MAGFET configurations.

FIG. 8 shows a magnetic sensor 20 based on the use of four MOS transistors arranged in two parallel pairs crossing each other in order to form a pattern inscribed in a square. The magnetic sensor 20 comprises a square gate G that is common to all transistors. At each angle of the square gate G, two perpendicular contacts of the original transistors are connected so as to form a so called "angle-contact". The magnetic sensor 20 thus comprises four angle-contacts positioned at each angle of the square gate G: a first angle-contact A, a second angle-contact B, a third angle-contact C and a fourth angle-contact D. The structure of such a magnetic sensor is for example further described in the article "A Novel Chopping-Spinning MAGFET Device", by V. Frick et al. (2010).

By electronically connecting two adjacent angle-contacts together to create a source and leaving the remaining two angle-contacts independent to create split drains, one creates a split-drain MAGFET structure where the source is twice the width of each drain. The symmetry of the magnetic sensor 20 allows creating four identical MAGFET devices in four perpendicular directions.

Figure 9A:
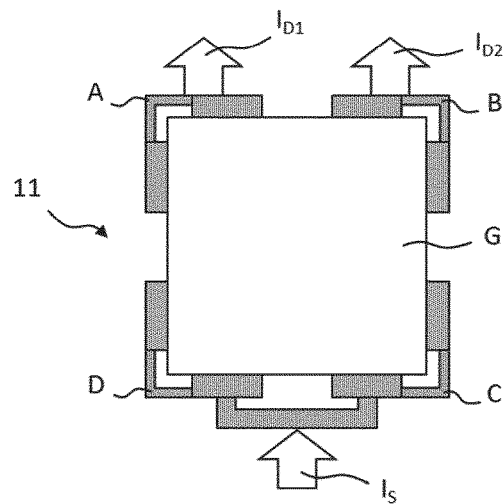
FIG. 9a illustrates a first configuration of the magnetic sensor of FIG. 8, corresponding to the first magnetic field effect transistor MAGFET of FIGS. 5a, 5b, 5c and 5d.

FIG. 9a illustrates a first configuration of the magnetic sensor 20, wherein the third angle-contact C and the fourth angle-contact D are connected together to form a source, the first angle-contact A is a first drain and the second angle-contact B is a second drain. The magnetic sensor 20 in its first configuration is the first MAGFET 11. A source current $I_S$ is used to bias the magnetic sensor 20 forming the first MAGFET 11. A first drain current $I_{D1}$ circulates in the first drain A and a second drain current $I_{D2}$ circulates in the second drain B of the magnetic sensor 20 forming the first MAGFET 11.

Figure 9B:
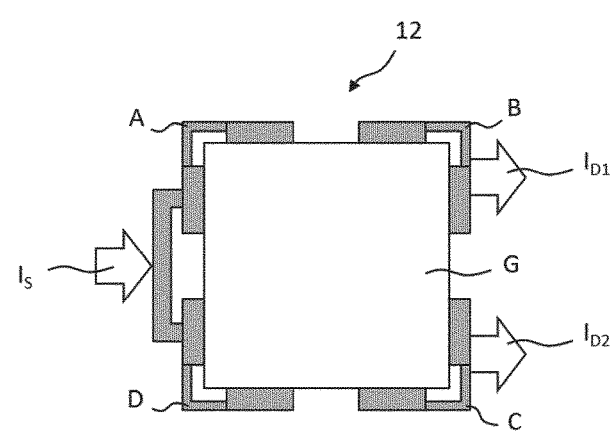
FIG. 9b illustrates a second configuration of the magnetic sensor of FIG. 8, corresponding to a second magnetic field effect transistor MAGFET.

FIG. 9b illustrates a second configuration of the magnetic sensor 20, wherein the first angle-contact A and the fourth angle-contact D are connected together to form a source, the second angle-contact B is a first drain and the third angle-contact C is a second drain. The magnetic sensor 20 in its second configuration is a second MAGFET 12. A source current $I_S$ is used to bias the magnetic sensor 20 forming the second MAGFET 12. A first drain current $I_{D1}$ circulates in the first drain B and a second drain current $I_{D2}$ circulates in the second drain C of the magnetic sensor 20 forming the second MAGFET 12.

Figure 9C:
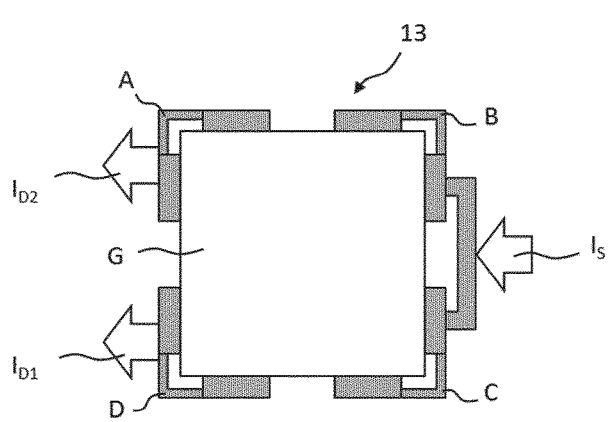
FIG. 9c illustrates a third configuration of the magnetic sensor of FIG. 8, corresponding to a third magnetic field effect transistor MAGFET.

FIG. 9c illustrates a third configuration of the magnetic sensor 20, wherein the second angle-contact B and the third angle-contact C are connected together to form a source, the fourth angle-contact D is a first drain and the first angle-contact A is a second drain. The magnetic sensor 20 in its third configuration is a third MAGFET 13. A source current $I_S$ is used to bias the magnetic sensor 20 forming the third MAGFET 13. A first drain current $I_{D1}$ circulates in the first drain D and a second drain current $I_{D2}$ circulates in the second drain A of the magnetic sensor 20 forming the third MAGFET 13.

Figure 9D:
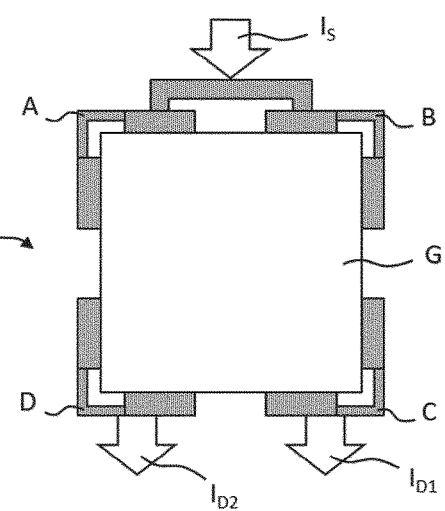
FIG. 9d illustrates a fourth configuration of the magnetic sensor of FIG. 8, corresponding to a fourth magnetic field effect transistor MAGFET.

FIG. 9d illustrates a fourth configuration of the magnetic sensor 20, wherein the first angle-contact A and the second angle-contact B are connected together to form a source, the third angle-contact C is a first drain and the fourth angle-contact D is a second drain. The magnetic sensor 20 in its fourth configuration is a fourth MAGFET 14. A source current $I_S$ is used to bias the magnetic sensor 20 forming the fourth MAGFET 14. A first drain current $I_{D1}$ circulates in the first drain C and a second drain current $I_{D2}$ circulates in the second drain D of the magnetic sensor 20 forming the fourth MAGFET 14.

Figure 10:
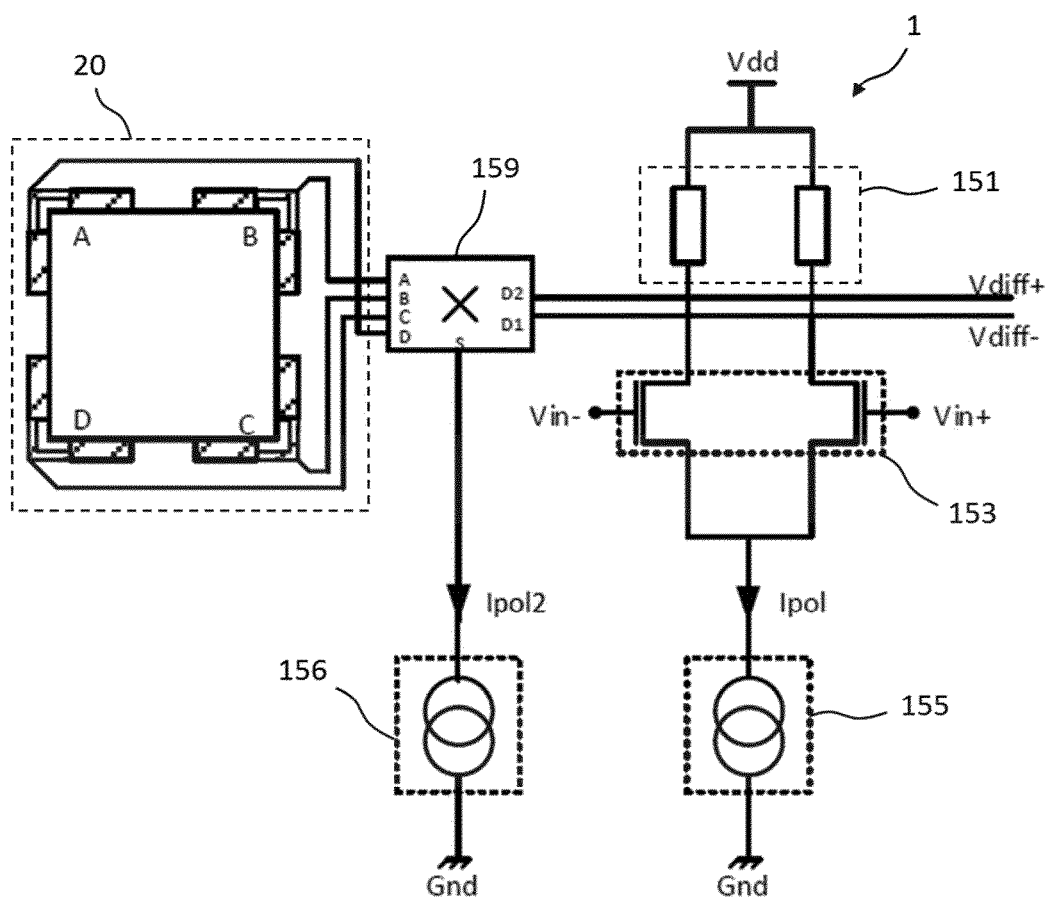
FIG. 10 illustrates the differential stage of a magnetic operational amplifier MOP based on the magnetic sensor of FIG. 8 having four possible symmetric MAGFET configurations, associated to a spinning current module.

The magnetic sensor 20 comprising four MAGFET configurations is preferentially used in a magnetic operational amplifier according to an embodiment of the invention, instead of a single classical MAGFET. Indeed the symmetrical shape of the magnetic sensor 20 allows applying a spinning-current technique in order to remove the offset and low-frequency noise of the magnetic sensor 20. FIG. 10 shows the differential stage 1 of a magnetic amplifier MOP comprising the magnetic sensor 20, wherein the differential signal conditioner further comprises a spinning-current module 159 that periodically alternates the first, second, third and fourth configurations of the magnetic sensor 20. FIG. 10 shows a particular embodiment where each MAGFET configuration of the magnetic sensor 20 is an n-type MAGFET configuration and the differential input pair 153 is an n-type differential input pair; connections are thus similar to those of FIG. 5a. Other embodiments, not shown, are possible, where:

each MAGFET configuration of the magnetic sensor 20 is an n-type MAGFET configuration and the differential input pair 153 is a p-type differential input pair; connections are then similar to those of FIG. 5b, or each MAGFET configuration of the magnetic sensor 20 is a p-type MAGFET configuration and the differential input pair 153 is a p-type differential input pair; connections are then similar to those of FIG. 5c, or each MAGFET configuration of the magnetic sensor 20 is a p-type MAGFET configuration and the differential input pair 153 is a n-type differential input pair; connections are then similar to those of FIG. 5*d*.

The invention claimed is:

1. A magnetic operational amplifier having a differential stage comprising:
    a first magnetic field effect transistor MAGFET and
    a differential signal conditioner comprising:
       a load stage,
       a differential input pair connected to the load stage and
       a biasing current source connected to the differential input pair,
wherein the first magnetic field effect transistor MAGFET is connected to the load stage as a second differential input pair and wherein the differential signal conditioner comprises a second biasing current source connected to the magnetic field effect transistor MAGFET.

2. The magnetic operational amplifier according to claim 1, wherein the first magnetic field effect transistor MAGFET is an n-type magnetic field effect transistor MAGFET.

3. The magnetic operational amplifier according to claim 1, wherein the differential signal conditioner comprises at least one differential amplification stage to further amplify a signal.

4. The magnetic operational amplifier according to claim 1, wherein the differential signal conditioner further comprises a chopper to eliminate the offset and low-frequency noise of the differential signal conditioner, the chopper comprising a first stage of modulation of a signal and a second stage of demodulation of the signal, the signal entering the second stage of demodulation being a voltage.

5. The magnetic operational amplifier according to claim 3, wherein the differential signal conditioner further comprises a chopper to eliminate the offset and low-frequency noise of the differential signal conditioner, the chopper comprising a first stage of modulation of the signal and a second stage of demodulation of the signal, the signal entering the second stage of demodulation being a voltage, and wherein the second stage of demodulation of the chopper is placed after a last differential amplification stage to eliminate the offset and low-frequency noise of the differential signal conditioner and of each differential amplification stage.

6. The magnetic operational amplifier according to claim 1, further comprising a magnetic sensor connected to the load stage as a second differential input pair and having:
    a first configuration corresponding to the first magnetic field effect transistor MAGFET,
    a second configuration corresponding to a second magnetic field effect transistor MAGFET,
    a third configuration corresponding to a third magnetic field effect transistor MAGFET and
    a fourth configuration corresponding to a fourth magnetic field effect transistor MAGFET,
and wherein the differential signal conditioner further comprises a spinning current module to eliminate the offset and low-frequency noise of the magnetic sensor, the spinning current module periodically alternating the first, second, third and fourth configurations of the magnetic sensor.

* * * * *